United States Patent
Nieh et al.

(10) Patent No.: US 8,629,037 B2
(45) Date of Patent: Jan. 14, 2014

(54) FORMING A PROTECTIVE FILM ON A BACK SIDE OF A SILICON WAFER IN A III-V FAMILY FABRICATION PROCESS

(75) Inventors: Chun-Feng Nieh, Hsinchu (TW); Chung-Yi Yu, Hsin-Chu (TW); Hung-Ta Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 114 days.

(21) Appl. No.: 13/244,340

(22) Filed: Sep. 24, 2011

(65) Prior Publication Data

US 2013/0078783 A1    Mar. 28, 2013

(51) Int. Cl.
*H01L 21/76* (2006.01)

(52) U.S. Cl.
USPC ............. 438/424; 257/E21.545; 257/E21.546

(58) Field of Classification Search
None
See application file for complete search history.

(56) References Cited

U.S. PATENT DOCUMENTS

| 5,001,536 | A  | * | 3/1991  | Fukuzawa et al. ............. 257/192 |
| 5,801,083 | A  | * | 9/1998  | Yu et al. ......................... 438/424 |
| 7,482,211 | B2 |   | 1/2009  | Nieh et al. |
| 2002/0081826 | A1 | * | 6/2002  | Rotondaro et al. ........... 438/585 |
| 2005/0250331 | A1 | * | 11/2005 | Arai et al. ..................... 438/691 |

OTHER PUBLICATIONS

Unpublished U.S. Appl. No. 13/273,463, filed Oct. 14, 2011 entitled "Junction Leakage Reduction Through Implantation", 22 pages.

* cited by examiner

*Primary Examiner* — Allen Parker
(74) *Attorney, Agent, or Firm* — Haynes and Boone, LLP (57) ABSTRACT

Provided is a method of fabricating a semiconductor device. The method includes forming a first dielectric layer over a first surface and a second surface of a silicon substrate. the first and second surfaces being opposite surfaces. A first portion of the first dielectric layer covers the first surface of the substrate, and a second portion of the first dielectric layer covers the second surface of the substrate. The method includes forming openings that extend into the substrate from the first surface. The method includes filling the openings with a second dielectric layer. The method includes removing the first portion of the first dielectric layer without removing the second portion of the first dielectric layer.

18 Claims, 10 Drawing Sheets

FORMING A PROTECTIVE FILM ON A BACK SIDE OF A SILICON WAFER IN A III-V FAMILY FABRICATION PROCESS

BACKGROUND

The semiconductor integrated circuit (IC) industry has experienced rapid growth in recent years. Technological advances in IC materials and design have produced various types of ICs that serve different purposes. The fabrication of some types of ICs may require forming a III-V family layer on a substrate, for example forming a III-V family layer on a substrate. These types of IC devices may include, as examples, light-emitting diode (LED) devices, radio frequency (RF) devices, and high power semiconductor devices.

Traditionally, manufacturers have formed the III-V family layer on a sapphire substrate. However, sapphire substrates are expensive. Thus, some manufacturers have been exploring forming III-V family layers on a silicon substrate, which is cheaper. However, existing methods of forming a III-V family layer on a silicon substrate may suffer from various drawbacks. One of these drawbacks involves outgas sing of the III-V family layer in one or more fabrication stages. The outgas sing of the III-V family layer may result in contamination of the silicon substrate. Therefore, existing fabrication processes may need to form a protective coating layer around the silicon substrate to prevent such contamination. The formation of the protective coating layer requires additional fabrication processes and therefore lengthens fabrication time and increases fabrication costs.

Therefore, while existing methods of forming III-V family layers on silicon substrates have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the features are formed in direct contact, and may also include embodiments in which additional features may be formed interposing the features, such that the features may not be in direct contact. Various features may be arbitrarily drawn in different scales for the sake of simplicity and clarity.

Figure 1:
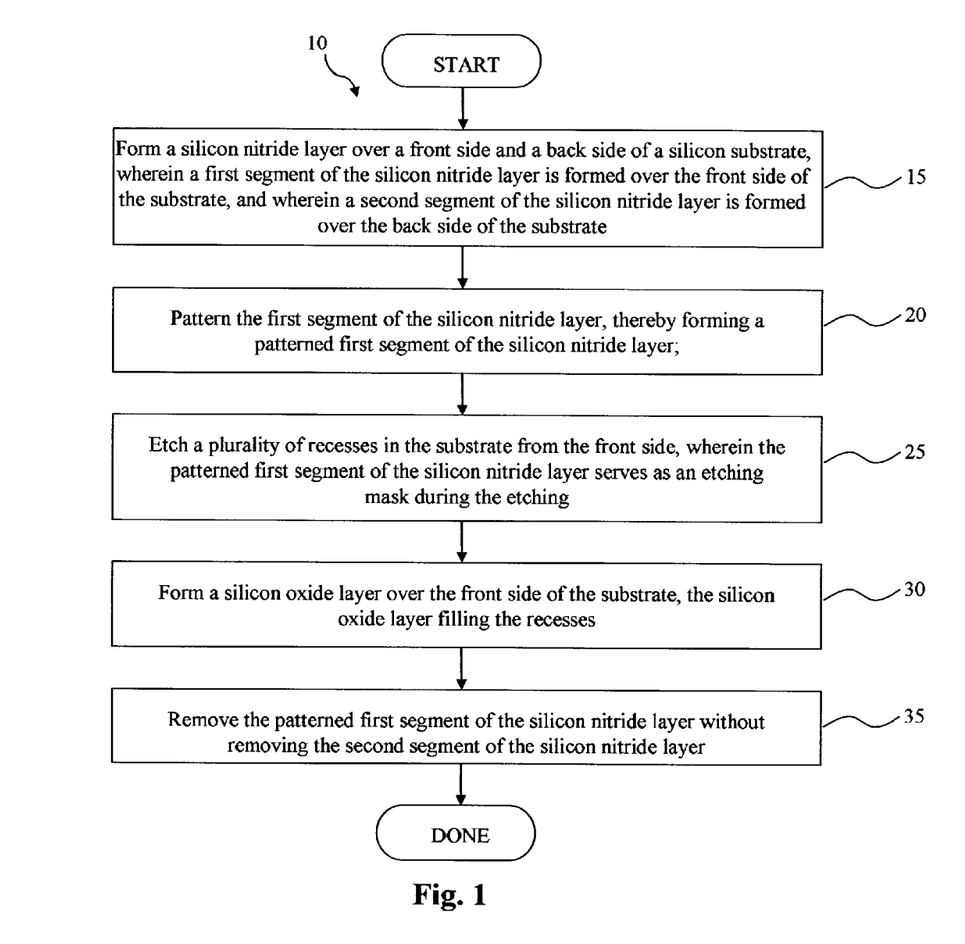
FIG. 1 is a flowchart illustrating a method for fabricating a semiconductor device according to various aspects of the present disclosure.

Illustrated in FIG. 1 is a flowchart of a method 10 for fabricating a semiconductor device according to various aspects of the present disclosure. Referring to FIG. 1, the method includes block 15, in which a silicon nitride layer is formed over a front side and a back side of a silicon substrate. A first segment of the silicon nitride layer is formed over the front side of the substrate. A second segment of the silicon nitride layer is formed over the back side of the substrate. The method 10 includes block 20, in which the first segment of the silicon nitride layer is patterned, thereby forming a patterned first segment of the silicon nitride layer. The method 10 includes block 25, in which a plurality of recesses is etched in the substrate from the front side. The patterned first segment of the silicon nitride layer serves as an etching mask during the etching. The method 10 includes block 30, in which a silicon oxide layer is formed over the front side of the substrate. The silicon oxide layer fills the recesses. The method 10 includes block 35, in which the patterned first segment of the silicon nitride layer is removed without removing the second segment of the silicon nitride layer.

It is understood that additional processes may be performed before, during, or after the blocks 15-35 shown in FIG. 1 to complete the fabrication of the semiconductor device, but these additional processes are not discussed herein in detail for the sake of simplicity.

FIGS. 2 to 10 are diagrammatic fragmentary cross-sectional side views of a semiconductor device at various fabrication stages according to embodiments of the method 10 of FIG. 1. It is understood that FIGS. 2 to 10 have been simplified for a better understanding of the inventive concepts of the present disclosure.

Figure 2:
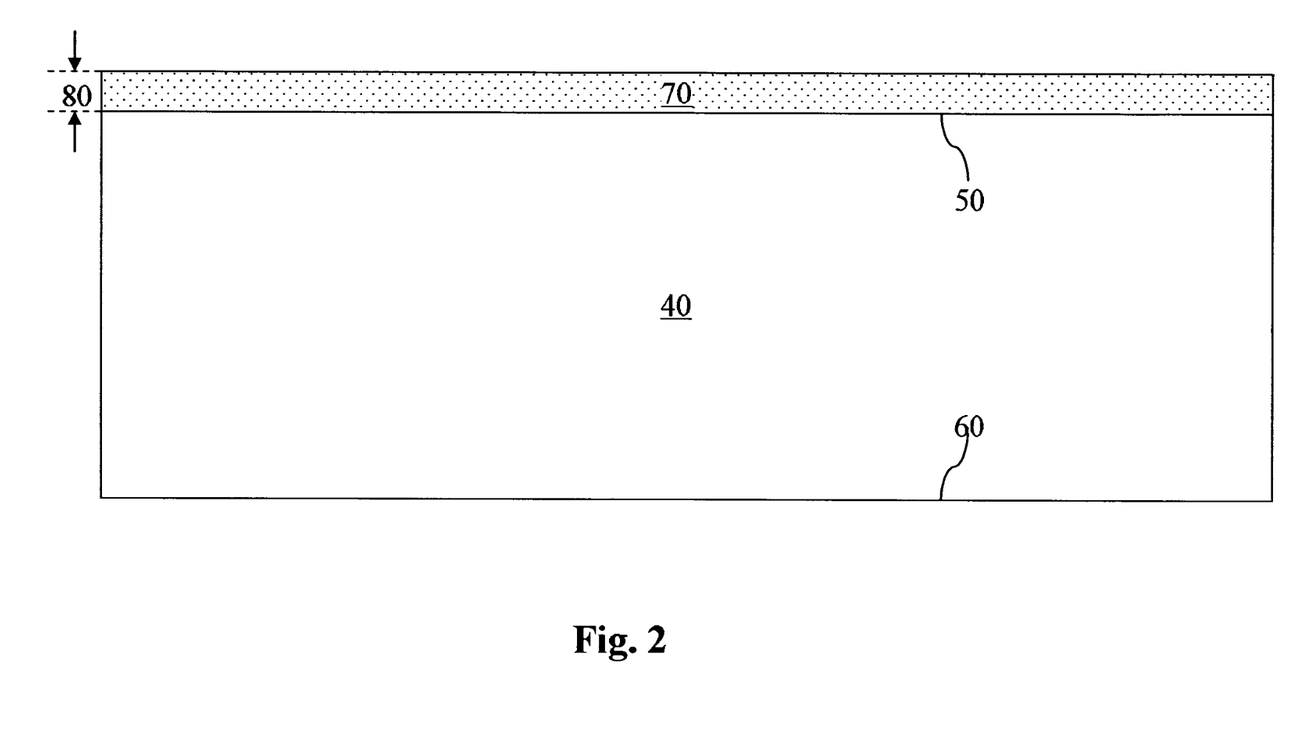
FIGS. 2-10 are diagrammatic fragmentary cross-sectional side views of a portion of a wafer at various stages of fabrication in accordance with various aspects of the present disclosure.

Referring to FIG. 2, a silicon wafer 40 is provided. The silicon wafer 40 may also be referred to as a silicon substrate 40. The silicon wafer 40 has a side or a surface 50, and a side or a surface 60 that is located opposite the side 50. In the illustrated embodiment, the side or surface 50 may be referred to as a front side or front surface, and the side or surface 60 may be referred to as a back side or back surface.

A dielectric layer 70 is formed on the side 50 of the silicon wafer 40. In an embodiment, the dielectric layer 70 includes a silicon oxide material and may be referred to as a pad oxide layer. The dielectric layer 70 has a thickness 80 (measured vertically in FIG. 2). In an embodiment, the thickness 80 is in a range from about 5 nanometers to about 20 nanometers.

Figure 3:
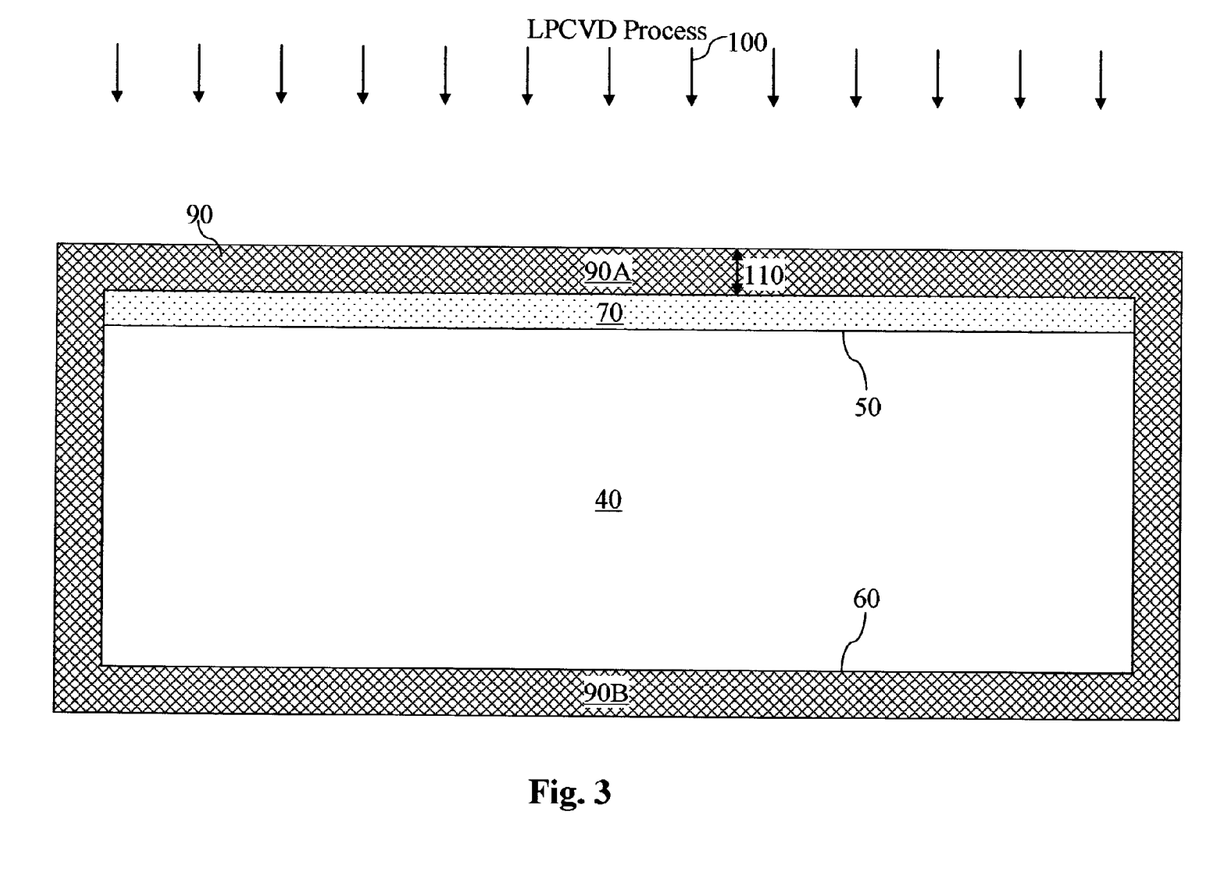

Referring now to FIG. 3, a dielectric coating layer 90 is formed around the silicon wafer 40. In an embodiment, the dielectric coating layer 90 includes a silicon nitride material. The dielectric coating layer 90 is coated completely around the silicon wafer 40, such that the silicon wafer 40 is surrounded by the dielectric coating layer 90. As illustrated in FIG. 3, a portion or segment 90A of the dielectric coating layer 90 is formed over the surface 50 (and more specifically, on the dielectric layer 70) of the silicon wafer 40, and a portion or segment 90B of the dielectric coating layer 90 is formed over the surface 60 of the silicon wafer 40. In an embodiment, the dielectric coating layer 90 is formed by a low pressure chemical vapor deposition (LPCVD) process 100. The dielectric coating 90 has a thickness 110. In an embodiment, the thickness 110 is in a range from about 5 nanometers to about 20 nanometers.

Figure 4:
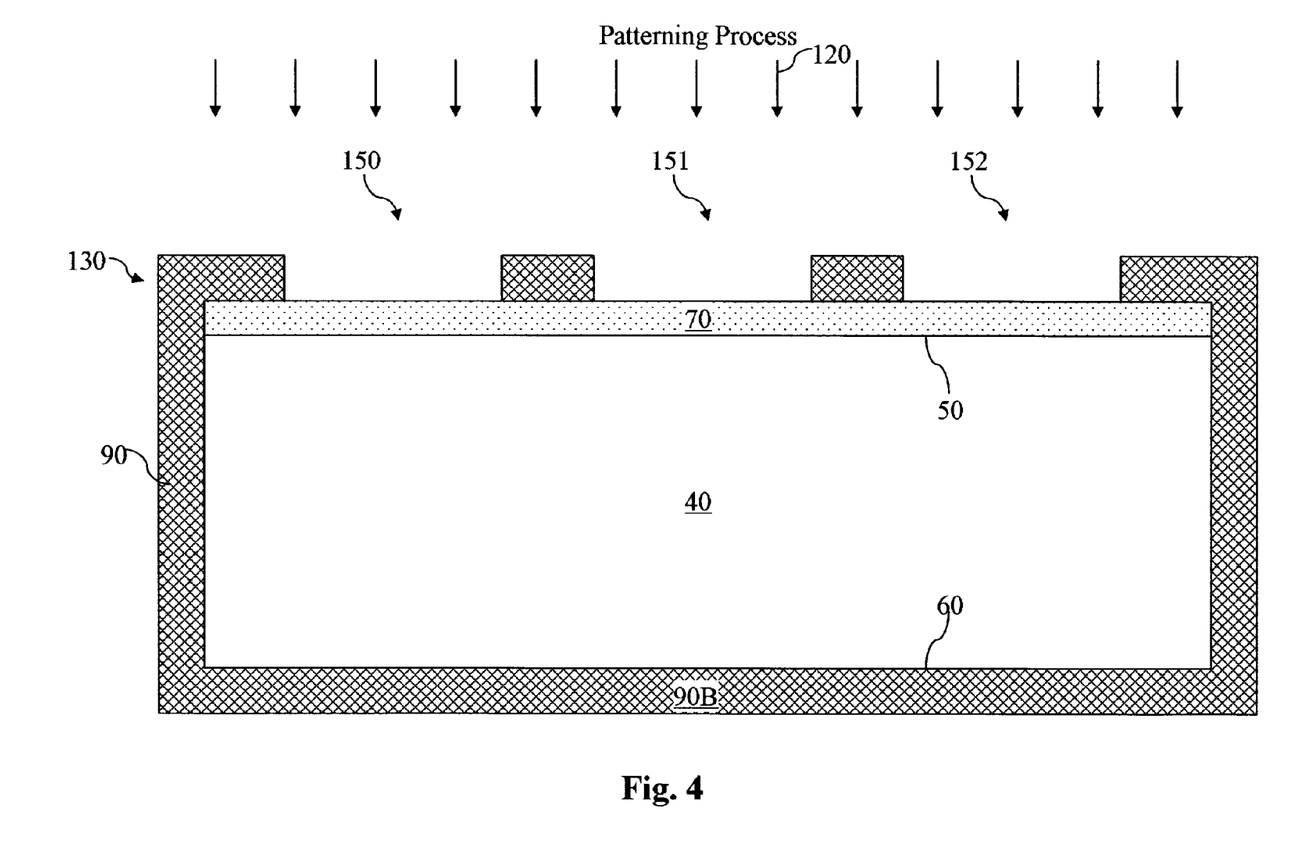

Referring now to FIG. 4, a patterning process 120 is performed to pattern the segment 90A of the dielectric coating layer 90 into a patterned dielectric hard mask 130. The patterning process 120 may be carried out using a photolithography process known in the art, which may include one or more masking, exposing, developing, baking, and rinsing processes (not necessarily in this order). For example, a patterned photoresist mask may be formed, and the photoresist mask may be used to pattern the segment 90A into the dielectric hard mask 130. The dielectric hard mask 130 contains a plurality of openings. Openings 150, 151, and 152 are shown herein as examples.

Figure 5:
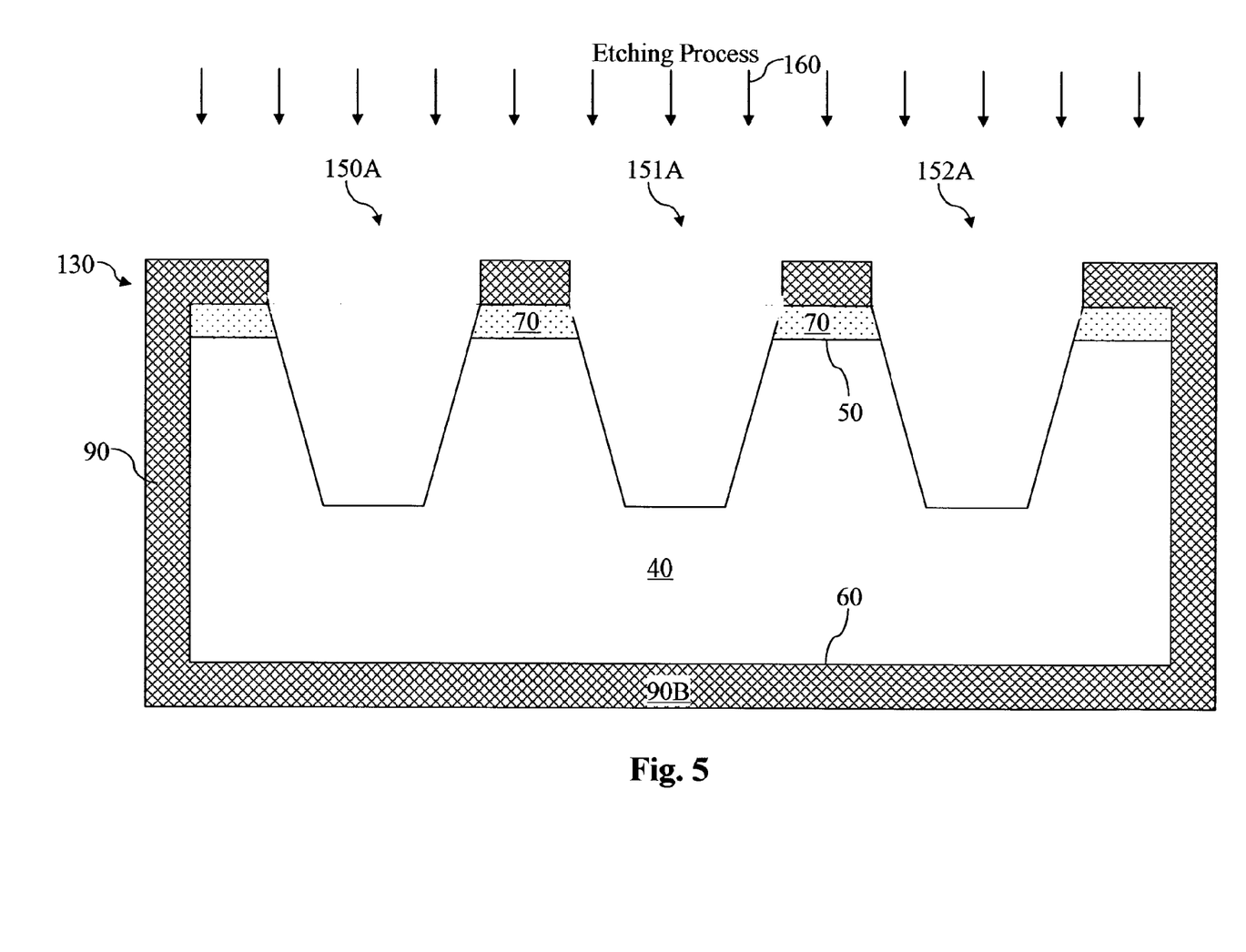

Referring now to FIG. 5, an etching process 160 is performed to extend the openings 150-152 further into the silicon wafer, thereby forming a plurality of recesses 150A-152A. The recesses 150A-152A may be referred to as trenches. The etching process 160 is performed using the dielectric hard mask 130 as an etching mask. The etching process 160 may include a wet etching process or a dry etching process.

Figure 6:
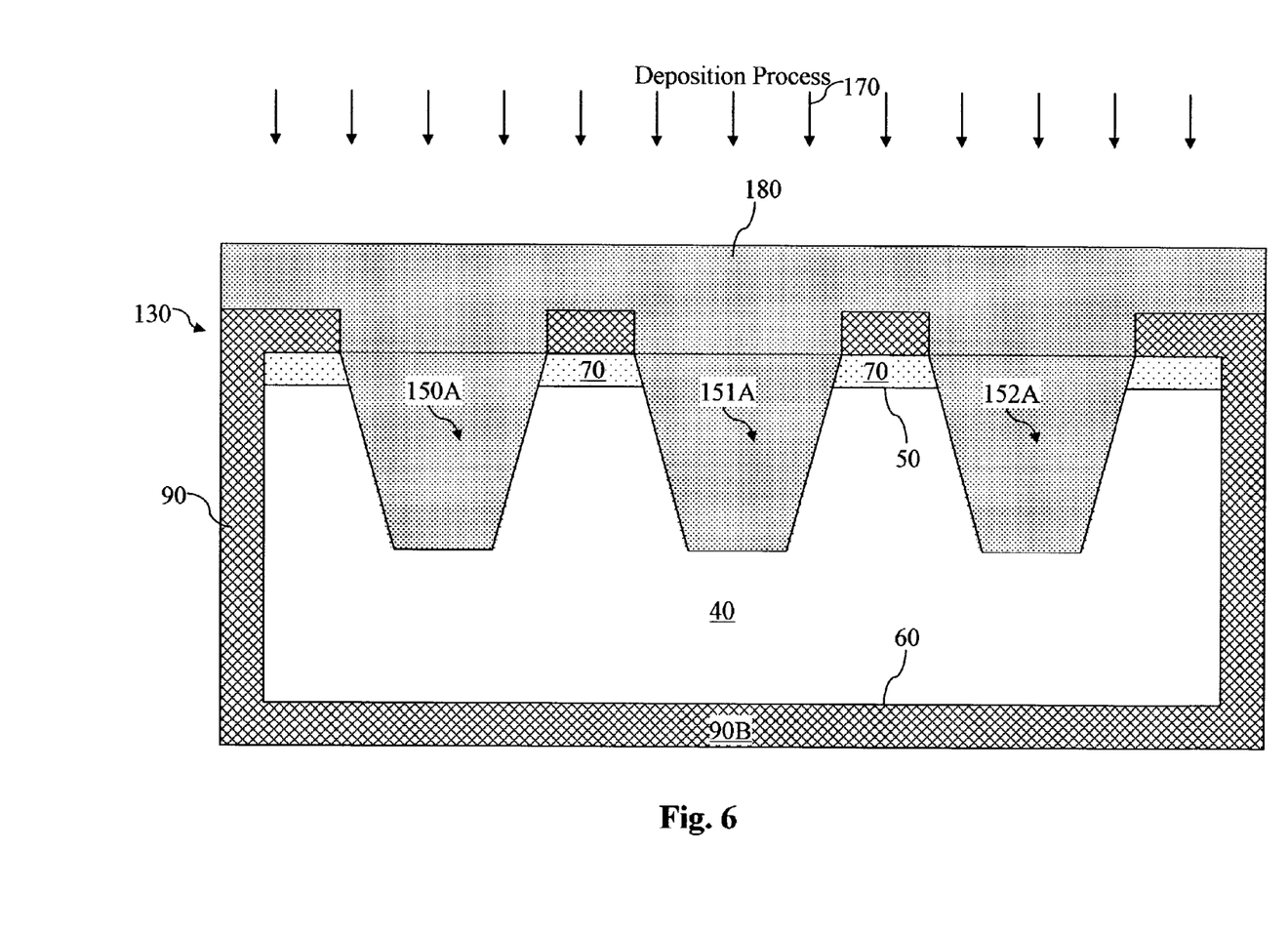

Referring now to FIG. 6, a deposition process 170 is performed to fill the recesses 150A-152A with a dielectric material 180. In an embodiment, the deposition process 170 includes a high-density plasma (HDP) deposition process. In other embodiments, the deposition process 170 may include other deposition techniques known in the art, for example chemical vapor deposition (CVD), physical vapor deposition (PVD), atomic layer deposition (ALD), or another suitable technique. In an embodiment, the dielectric material 180 includes silicon oxide. The dielectric material 180 completely fills the recesses 150A-152A. Portions of the dielectric material 180 also cover surfaces of the dielectric hard mask 130.

Figure 7:
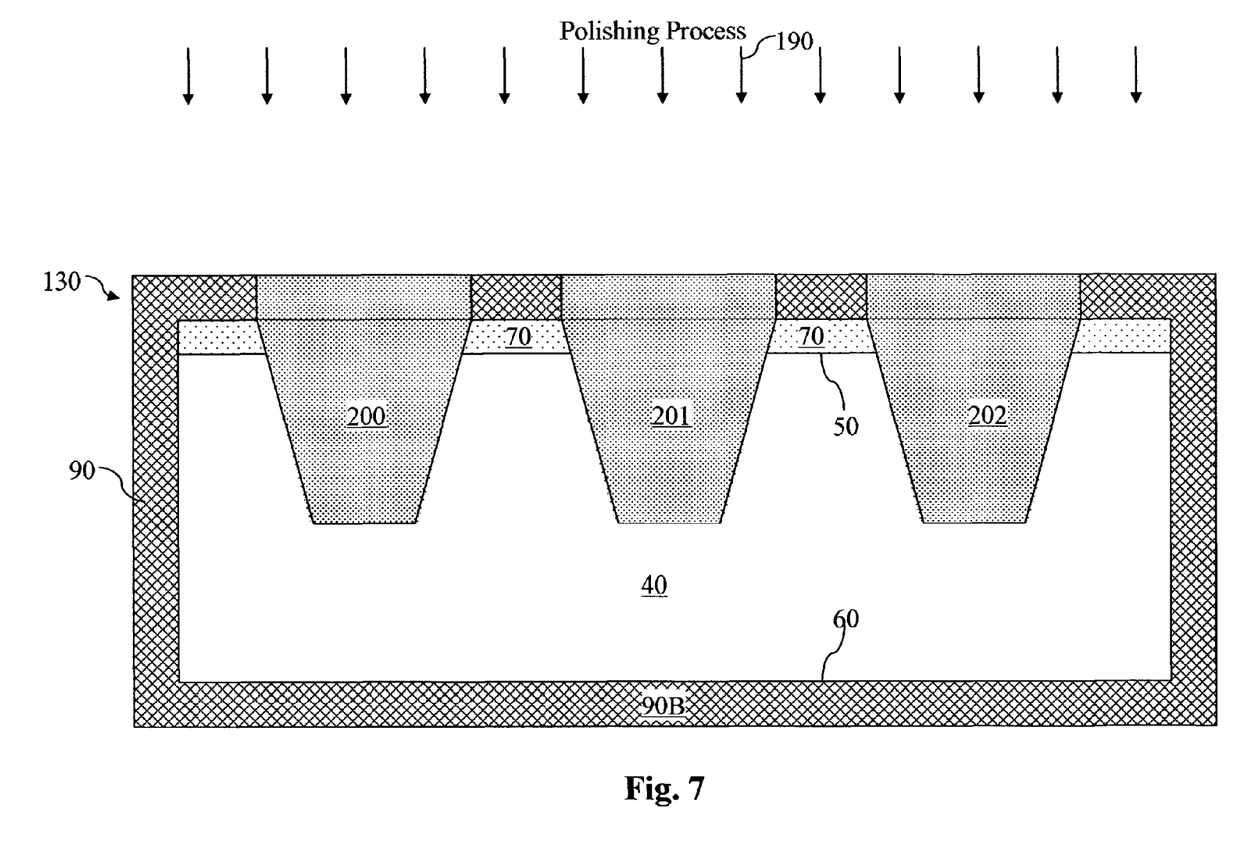

Referring now to FIG. 7, a polishing process 190 is performed on the dielectric material 180. In an embodiment, the polishing process 190 includes a chemical-mechanical-polishing (CMP) process. In an embodiment, the CMP process has a relatively high etching selectivity between a silicon oxide material and a silicon nitride material. For example, the etching selectivity between silicon oxide and silicon nitride may be greater than about 10:1. Generally, etching selectivity refers to the respective rates at which different materials are removed. A high etching selectivity results in a faster removal of one material in comparison with another material. The etching selectivity can be tuned by factors such as CMP slurry selection and downward pressure application (i.e., force applied to a CMP polishing head).

Here, the CMP process may be tuned in a manner such that silicon oxide (e.g., the dielectric material 180) is polished away while silicon nitride (e.g., the dielectric hard mask 130) substantially remains on the wafer. The polishing process 190 may be performed until a substantially smooth and planarized surface is achieved. The portions of the dielectric material 180 remaining in the recesses 150A-152A form shallow trench isolation (STI) structures 200-202.

Figure 8:
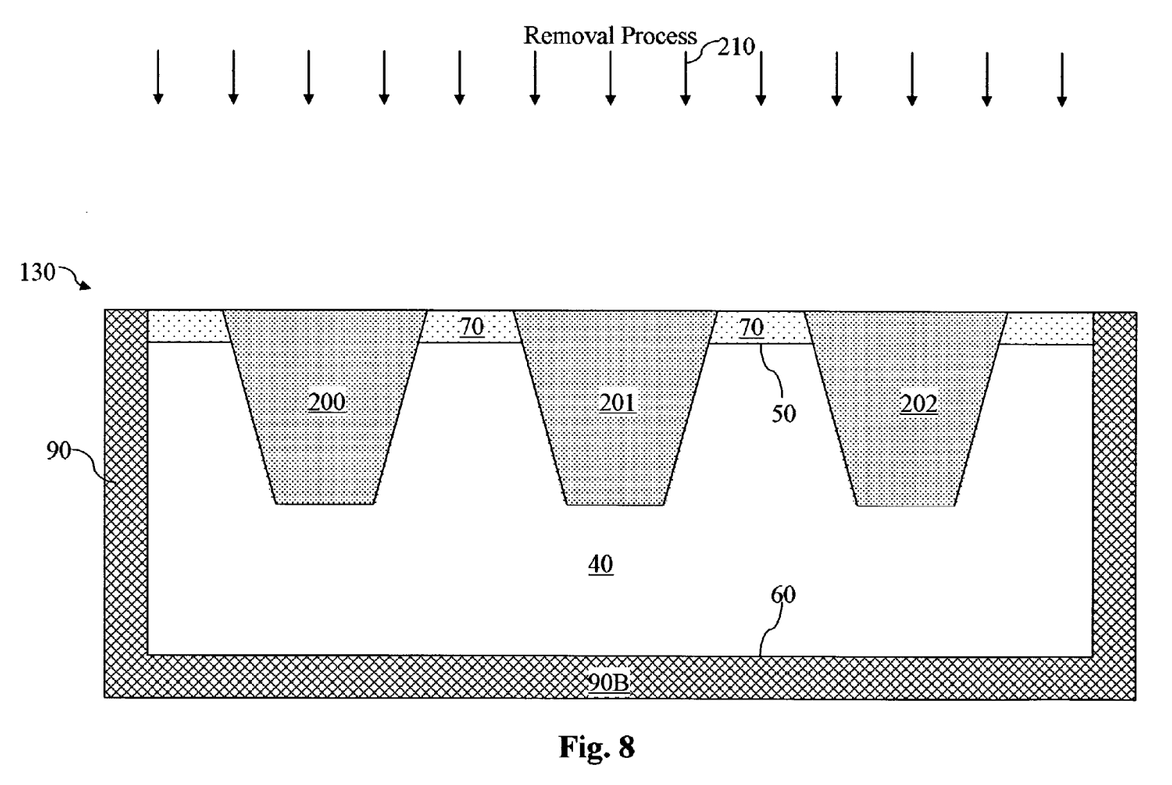

Referring now to FIG. 8, a removal process 210 is performed to remove the dielectric hard mask 130 (which includes patterned portions of the segment 90A of the dielectric layer 90) from the silicon wafer 40. In an embodiment, the removal process 210 involves a single wafer dielectric material removal process. In more detail, a plurality of additional silicon wafers similar to the silicon wafer 40 may be provided. Each of these silicon wafers has undergone similar fabrication processes as the silicon wafer 40. To remove the dielectric hard masks (containing silicon nitride in the present embodiment), the single wafer dielectric material removal process is performed by applying a chemical solution from the front side to each individual wafer's dielectric hard mask. In an embodiment, the chemical solution includes hot phosphoric acid. The chemical solution is sprayed onto one silicon wafer, and then the next. Since the chemical solution is sprayed from the front side, the removal process 210 does not affect the segment 90B of the dielectric coating layer. Rather, only the remaining portions of the segment 90A of the dielectric coating layer—the dielectric hard mask 130—is removed by the removal process 210.

Meanwhile, the other portions of the dielectric coating layer 90, for example the segment 90B covering the back side 60 of the silicon wafer, remain intact and are largely unaffected by the single wafer dielectric material removal process. Hence, the silicon wafer 40 is still coated with the dielectric coating layer 90 on its back surface 60 as well as its side surfaces even after the single wafer dielectric material removal process is performed.

In comparison, traditional fabrication processes typically employ a batch removal approach to remove a dielectric hard mask. Namely, a batch of wafers may be placed inside a container containing a chemical solution, and the chemical solution effectively removes the dielectric coating layer from all surfaces or sides of these wafers. In other words, the batch removal process removes the dielectric coating layer segment on the front side of each wafer, as well as the dielectric coating layer segments on the back side of each wafer. Therefore, it can be seen that one difference between the traditional fabrication processes and the one discussed above according to the various aspects of the present disclosure is the following: the dielectric coating layer is completely removed for the traditional fabrication processes, whereas the dielectric coating layer 90 is only partially removed for the embodiments disclosed herein.

After the dielectric hard mask 130 is removed from the front side 50 of the silicon wafer 40, additional polishing processes may be performed to ensure that the front side surface of the silicon wafer remains smooth and planarized. In some embodiments, the pad oxide layer 70 may also be removed.

Figure 9:
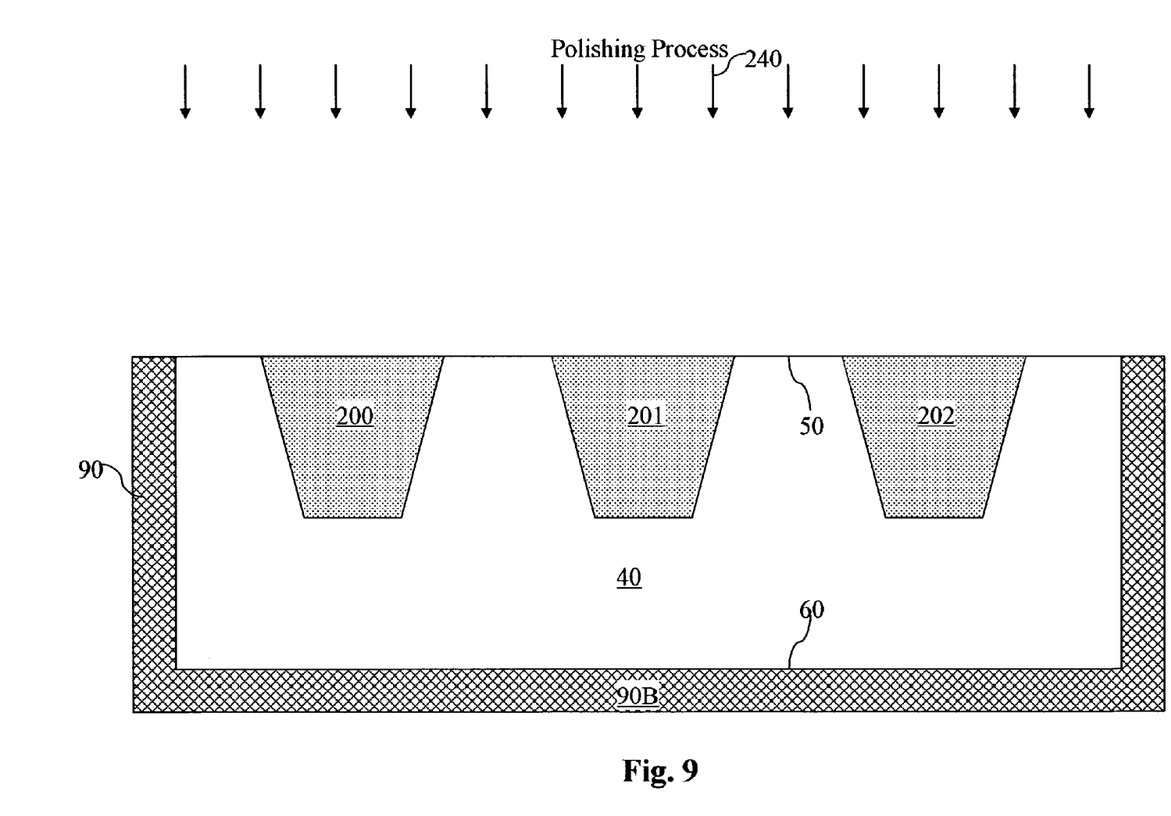

FIGS. 2-8 and the associated descriptions above disclose a first fabrication flow according to the various aspects of the present disclosure. A second fabrication flow according to the various aspects of the present disclosure is illustrated in FIG. 9. For the sake of clarity and consistency, similar components and processes are labeled the same throughout FIGS. 2-9. In the second fabrication flow, processes substantially identical to those illustrated in FIGS. 2-6 are performed to the silicon wafer 40 as well. That is, a dielectric coating layer 90 is formed around the silicon wafer 40, the portion of the dielectric coating layer 90 formed over the front side 50 of the silicon wafer 40 is patterned into a dielectric hard mask 130 having openings, trenches are etched into the silicon wafer 40 from the front side 50 while using the dielectric hard mask 130 as an etching mask, and a dielectric material is deposited over the front side 50 of the silicon wafer 40, such that the trenches are filled with the dielectric material.

Referring now to FIG. 9, at this stage of fabrication, instead of performing the polishing process 190 of FIG. 7 (where a high etching selectivity between silicon oxide and silicon nitride is used), a polishing process 240 is performed on the dielectric material 180. In an embodiment, the polishing process 240 includes a CMP process with a relatively low etching selectivity between silicon oxide and silicon nitride, for example, an etching selectivity about 1:1. Thus, the silicon oxide material (e.g., the dielectric material 180 and the pad oxide layer 70) and the silicon nitride material (e.g., the dielectric hard mask 130) are removed at substantially the same rates. Therefore, the dielectric material 180 outside the recesses 150A-152A (FIG. 5) are polished away at the same time that the dielectric hard mask 130 and the pad oxide layer 70 are polished away. The polishing process 240 stops when a silicon surface of the silicon wafer 40 is reached. The polishing process 240 forms STI structures 200-202 filling the trenches 150A-152A. The front surface 50 of the silicon wafer 40 is substantially smooth and planarized after the completion of the polishing process 240.

Since the polishing process 240 is configured to remove the dielectric hard mask 130 from the silicon wafer, no subsequent single wafer dielectric material removal process needs to be performed. That is, the silicon wafer 40 (as well as other similar silicon wafers) does not need to undergo a single wafer dielectric material removal process where a chemical solution (such as hot phosphoric acid) is sprayed onto the wafer surface from the front side for each individual wafer to remove the dielectric hard mask containing silicon nitride. Rather, the removal of the dielectric hard mask 130 can be carried out using the polishing process 240. Hence, the polishing process 240 may also be referred to as a dielectric material removal process.

It can also be seen that the polishing process 240 does not affect the back side 60 of the silicon wafer 40. The segment 90B of the dielectric coating layer 90 still remains on the back side after the polishing process 240 is performed. Therefore, similar to the first fabrication flow discussed above, the second fabrication flow still involves removing only a portion of the dielectric coating layer 90—the portion formed over the front side 50 of the silicon wafer.

The selective partial removal of the dielectric coating layer 90 according to the present disclosure (for example, either the first fabrication flow according to FIGS. 2-8 or the second fabrication flow according to FIGS. 2-6 and 9) offers advantages over traditional fabrication processes. It is understood, however, that other embodiments may offer different advantages, and that no particular advantage is required for all embodiments. One advantage is that the present disclosure eliminates or bypasses many processing steps that are required by traditional fabrication processes.

In more detail, in the traditional fabrication processes, to prevent contamination caused by outgassing of a III-V family layer (formed on the silicon wafer in a later fabrication stage), a silicon nitride layer needs to be formed on the back side of the silicon wafer. Thus, after the batch dielectric material removal process (where all of the dielectric coating layer is removed from the silicon wafer), the silicon wafer is turned over (flipped upside down). A cleaning process is then performed to clean the back surface of the silicon wafer. After the cleaning, a silicon nitride layer is formed on the back side of the silicon wafer. Thereafter, the silicon wafer is turned over again so that front side processing of the silicon wafer may continue, where one of the front side processes includes the formation of a III-V family layer. These extra fabrication steps (e.g., flipping the wafer over, cleaning the back side, forming a silicon nitride layer, flipping the wafer back) prolong fabrication time, waste fabrication resources, and increase fabrication costs.

In contrast, the first fabrication flow and the second fabrication flow of the present disclosure each bypass these additional fabrication processes required in traditional fabrication processes. The single wafer dielectric material process of the first fabrication flow and the polishing process of the second fabrication flow each selectively remove the portion of the dielectric coating layer from the front side of the silicon wafer, while leaving the portion of the dielectric coating layer on the back side of the silicon wafer intact. In this manner, the portion of the dielectric coating layer on the back side of the silicon wafer can serve as a protective mask to prevent contamination caused by III-V family layer outgas sing.

In other words, according to the present disclosure, the formation of a silicon nitride protective mask on the back side of the silicon wafer does not require a dedicated process. Instead, through calculated and carefully fabrication processing steps, remnants of the dielectric coating layer (which would have been completely removed by existing fabrication processes) can now be used as the protective silicon nitride layer on the back side of the silicon wafer. Consequently, processing steps such as wafer flipping, wafer back side cleaning, silicon nitride deposition on the wafer back side, and wafer flipping again may all be eliminated. The elimination of all these processing steps shortens fabrication time and reduces fabrication costs.

Another advantage offered by the embodiments disclosed herein is reduced risks of causing wafer damage during processing. It is understood that electronic circuit components may be formed on the front side of the silicon wafer. These electronic circuit components may include transistors, resistors, capacitors, and inductors, etc. In conventional fabrication processes, flipping the silicon wafer upside down (and then later back up again) may cause damages on the wafer, specifically damages to these electronic circuit components. For example, these damages may be caused by suboptimal handling of the wafer during the flipping processes. The damaged electronic circuit components may reduce yield, and may even result in scrapped silicon wafers. As such, these extra fabrication processes dedicated to the formation of a back side silicon nitride layer in a traditional fabrication process increases risk of wafer damage, and are therefore undesirable.

In comparison, the embodiments of the present disclosure need not flip the wafers upside down to form a protective silicon nitride layer on the back side of the silicon wafer. Therefore, the embodiments of the present disclosure reduce risks of wafer damage by eliminating unnecessary handling of the wafer during its fabrication.

It is understood that in some embodiments, the first fabrication flow and the second fabrication flow discussed above may be combined. For example, a low selectivity wafer polishing process may be performed, and thereafter a single wafer dielectric material removal process may be performed. This combined fabrication flow entails substantially the same advantages discussed above. Namely, it achieves the objective of providing a silicon nitride protective back side layer to prevent III-V family layer outgassing, while offering shortened process time and reduced fabrication costs, as well as decreased risks of wafer damage.

Figure 10:
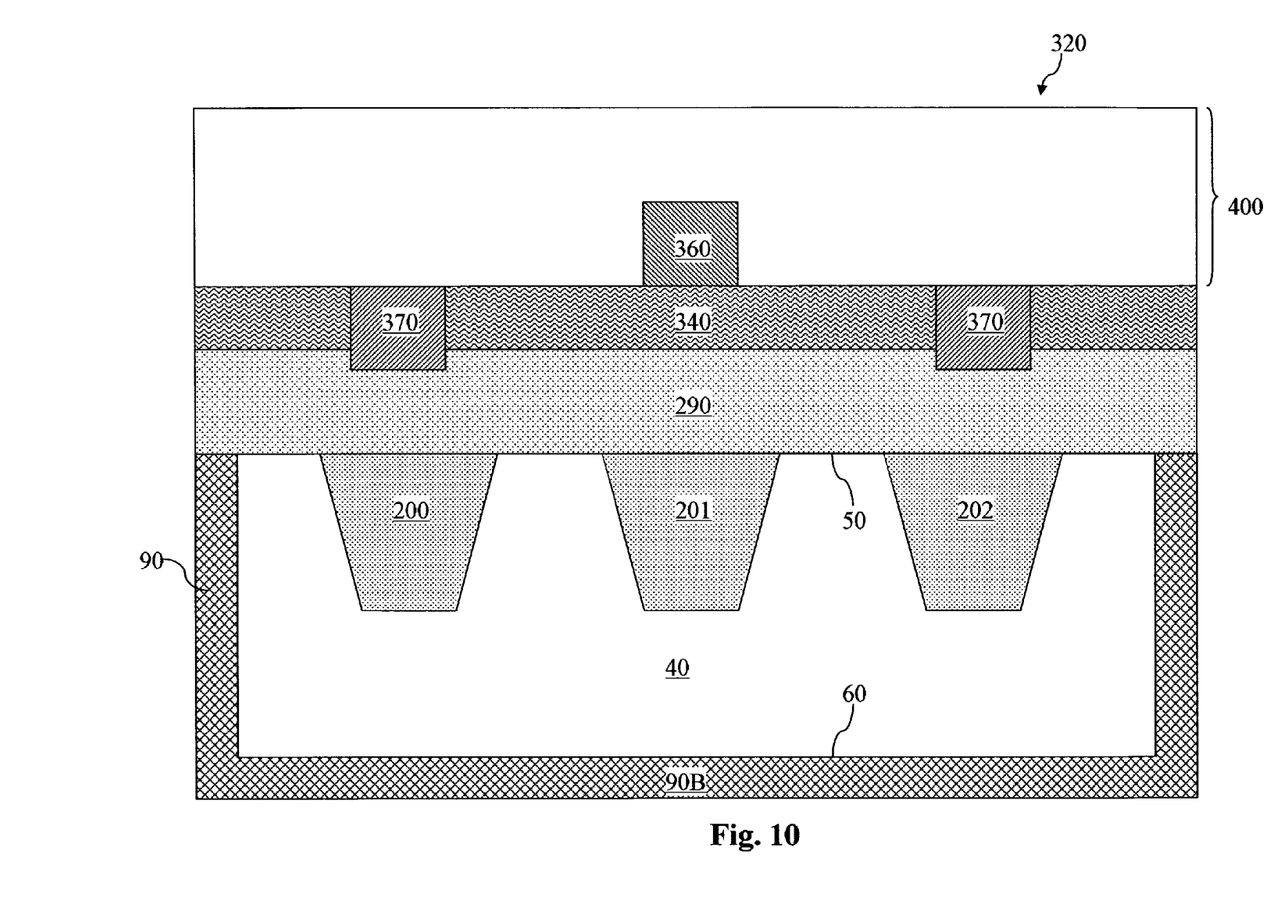

Additional fabrication processes may be performed to complete the fabrication of the semiconductor device discussed herein. For the sake of providing an example, FIG. 10 illustrates the formation of a III-V family layer on the silicon wafer 40. Referring to FIG. 10, a III-V family layer 290 is formed over the front side 50 of the silicon wafer 40. The III-V family layer includes an element from a "III" family of the periodic table, and another element from a "V" family of the periodic table. For example, the III family elements may include: Boron, Aluminum, Gallium, etc, and the V family elements may include: Nitrogen, Phosphorous, Arsenic, etc. Thus, one example of a III-V family layer is a gallium nitride layer.

The III-V family layer 290 may be formed by one or more epitaxial-growth processes known in the art, which may be performed at high temperatures. In some embodiments, the high temperatures range from about 800 degrees Celsius to about 1400 degrees Celsius. Although not illustrated, it is understood that a buffer layer may be formed between the silicon wafer 40 and the III-V family layer 290. It is further understood that a cladding layer (not illustrated herein) may be formed over the III-V family layer 290 to enhance its electrical properties.

Various types of semiconductor devices can be formed using a III-V family layer such as the III-V family layer 290 of FIG. 10. For example, a high power semiconductor device 320 may be formed. The semiconductor device 320 includes the silicon wafer 40 and the III-V family layer 290. The high power semiconductor device 320 also includes an additional III-V family layer 340 that is formed over the III-V family layer 290. The III-V family layer 340 includes a different material composition than the III-V family layer 290.

The high power semiconductor device 320 includes a transistor formed by a gate device 360 and source/drain regions 370. The gate device 360 (or gate structure) is formed over the III-V family layer 340, and source/drain regions 370 are formed in the III-V family layer 340 and partially in the III-V family layer 290. The gate device 360 may include a gate dielectric component and a gate electrode component. The source/drain regions 370 may be formed by one or more doping or implantation processes. When the transistor device is turned on, a conductive channel is formed below the gate device 360 and between the source/drain regions 370. An electrical current will flow in the conductive channel.

The high power semiconductor device 320 also includes an interconnect structure 400 formed over the aluminum III-V family layer 340. The interconnect structure 400 includes a plurality of interconnect layers, also referred to as metal layers. Each metal layer contains a plurality of metal lines that route electrical signals. The metal layers are interconnected together by vias. Contacts are also formed over the gate device 360 and the source/drain regions 370 so that connections may be established with external devices. For the sake of simplicity, these metal lines, vias and contacts are not specifically illustrated in FIG. 10. Also, additional fabrication processes may be performed to finish the fabrication of the high power device 320, such as passivation, testing, and packaging processes. These processes are also not shown or discussed herein for reasons of simplicity.

It is understood that the high power device 320 shown in FIG. 10 and discussed above merely illustrates an example use of a III-V family layer formed over a silicon wafer. In other embodiments, the methods disclosed herein may be used to form hetero-structure devices, light-emitting diode (LED) devices, radio-frequency (RF) devices, and high electron mobility transistor (HEMT) devices. In fact, as long as it is desirable to form a III-V family layer on a silicon substrate, the method and structure disclosed by the present disclosure may be applied to achieve the various advantages discussed above.

One of the broader forms of the present disclosure involves a method. The method includes: forming a first dielectric layer over a first surface and a second surface of a silicon substrate, the first and second surfaces being opposite surfaces, wherein a first portion of the first dielectric layer covers the first surface of the substrate, and a second portion of the first dielectric layer covers the second surface of the substrate; forming openings that extend into the substrate from the first surface; filling the openings with a second dielectric layer; and removing the first portion of the first dielectric layer without removing the second portion of the first dielectric layer.

Another of the broader forms of the present disclosure involves a method of fabricating a semiconductor device. The method includes: forming a silicon nitride layer over a front side and a back side of a silicon substrate, wherein a first segment of the silicon nitride layer is formed over the front side of the substrate, and wherein a second segment of the silicon nitride layer is formed over the back side of the substrate; patterning the first segment of the silicon nitride layer, thereby forming a patterned first segment of the silicon nitride layer; etching a plurality of recesses in the substrate from the front side, wherein the patterned first segment of the silicon nitride layer serves as an etching mask during the etching; forming a silicon oxide layer over the front side of the substrate, the silicon oxide layer filling the recesses; and removing the patterned first segment of the silicon nitride layer without removing the second segment of the silicon nitride layer.

Still another of the broader forms of the present disclosure involves a method of fabricating a semiconductor device. The method includes: providing a plurality of silicon wafers; coating each of the wafers with a silicon nitride material; performing a patterning process from a front side of the wafers on the silicon nitride material to form a plurality of patterned silicon nitride masks; etching, through the patterned silicon nitride masks, a plurality of trenches in each of the wafers, wherein the etching is performed from the front side of the wafers; filling the trenches with a silicon oxide material; and removing the patterned silicon nitride masks by dispensing an acid from the front side to each individual wafer, wherein the removing is carried out in a manner such that the silicon nitride material coated around a back side of each wafer is not removed by the removing.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
    forming a first dielectric layer over
        a first surface and
        a second surface of a silicon substrate,
        the first and second surfaces being opposite surfaces,
        wherein
            a first portion of the first dielectric layer covers the first surface of the substrate, and
            a second portion of the first dielectric layer covers the second surface of the substrate;
    forming openings that extend into the substrate from the first surface;
    filling the openings with a second dielectric layer;
    removing the first portion of the first dielectric layer without removing the second portion of the first dielectric layer;
    forming a first III-V family layer over the first surface of the substrate and covering the second dielectric layer;
    forming a second III-V family layer over the first III-V family layer and over the second dielectric layer,
        wherein the second III-V family layer is comprised of a different III-V family material than the first III-V family layer;
    forming a gate structure over the second III-V family layer; and
    forming a first source/drain region and a second source/drain region
        in the second III-V family layer and
        partially in the first III-V family layer.

2. The method of claim 1, wherein the removing the first portion of the first dielectric layer is carried out using a single wafer process.

3. The method of claim 2, wherein the single wafer process includes dispensing an acid on the first surface of the substrate to remove the first portion of the first dielectric layer.

4. The method of claim 1, further including: before the forming the openings, patterning the first portion of the first dielectric layer to form a patterned dielectric mask, and wherein the forming the openings is performed using the patterned dielectric mask.

5. The method of claim 1, wherein:
the first dielectric layer includes a silicon nitride material; and
the second dielectric layer includes a silicon oxide material.

6. The method of claim 1, wherein the forming the first dielectric layer is carried out using a low pressure chemical vapor deposition (LPCVD) process.

7. The method of claim 1, further including: after the filling, performing a polishing process on the second dielectric layer.

8. The method of claim 7, wherein the polishing process has a low etching selectivity between the first and second dielectric layers.

9. A method of fabricating a semiconductor device, comprising:
forming a silicon nitride layer over
a front side and
a back side of a silicon substrate,
wherein a first segment of the silicon nitride layer is formed over the front side of the substrate, and
wherein a second segment of the silicon nitride layer is formed over the back side of the substrate;
patterning the first segment of the silicon nitride layer, thereby forming a patterned first segment of the silicon nitride layer;
etching a plurality of recesses in the substrate from the front side,
wherein the patterned first segment of the silicon nitride layer serves as an etching mask during the etching;
forming a silicon oxide layer over the front side of the substrate,
the silicon oxide layer filling the recesses;
removing the patterned first segment of the silicon nitride layer without removing the second segment of the silicon nitride layer;
forming a first III-V family layer over the front side of the substrate and covering the silicon oxide;
forming a second III-V family layer over the first III-V family layer and over the silicon oxide,
wherein the second III-V family layer is comprised of a different III-V family material than the first III-V family layer;
forming a gate structure over the second III-V family layer; and
forming a first source/drain region and a second source/drain region
in the second III-V family layer and
partially in the first III-V family layer.

10. The method of claim 9, wherein the removing includes applying a hot phosphoric acid to the patterned first segment of the silicon nitride layer from the front side.

11. The method of claim 9, further including: after the forming the silicon oxide layer, performing a polishing process to the silicon oxide layer.

12. The method of claim 11, wherein the polishing process has a low etching selectivity between silicon oxide and silicon nitride, and wherein the polishing process removes the patterned first segment of the silicon nitride layer.

13. The method of claim 9, further including: before the forming the silicon nitride layer, forming a pad oxide layer over the front side of the substrate, and wherein the first segment of the silicon nitride layer is formed on the pad oxide layer.

14. The method of claim 9, wherein the forming the silicon nitride layer is carried out using a low pressure chemical vapor deposition (LPCVD) process.

15. A method of fabricating a semiconductor device, comprising:
providing a plurality of silicon wafers;
coating each of the wafers with a silicon nitride material;
performing a patterning process
from a front side of the wafers
on the silicon nitride material
to form a plurality of patterned silicon nitride masks;
etching,
through the patterned silicon nitride masks,
a plurality of trenches in each of the wafers,
wherein the etching is performed from the front side of the waters; filling the trenches
with a silicon oxide material
to form a plurality of shallow trench isolation (STI) structures;
removing the patterned silicon nitride masks
by dispensing an acid from the front side to each individual wafer,
wherein the removing is carried out in a manner such that the silicon nitride material coated around a back side of each wafer is not removed by the removing;
forming a gallium nitride layer over the front side of the wafers and over the silicon oxide material;
forming a III-V family layer over the front side of the wafers and over the silicon oxide material,
wherein the III-V family layer is comprised of a different III-V family material than the gallium nitride layer;
forming a gate structure over the III-V family layer and the gallium nitride layer; and
forming a first source/drain region and a second source/drain region in the one of the III-V family layer and the gallium nitride layer and partially in the other of the III-V family layer and the gallium nitride layer.

16. The method of claim 15, further including:
before the coating, forming a pad oxide layer on the front side of each of the wafers; and
after the filling, performing a chemical-mechanical-polishing (CMP) process to the silicon oxide material.

17. The method of claim 16, wherein the CMP process is performed until the patterned silicon nitride masks are removed.

18. The method of claim 17, wherein the CMP process has an etching selectivity that is approximately 1:1 between silicon nitride and silicon oxide.

* * * * *